United States Patent
Wang

(10) Patent No.: US 11,893,331 B2
(45) Date of Patent: Feb. 6, 2024

(54) DEVICE VERIFICATION METHOD, UVM VERIFICATION PLATFORM, ELECTRONIC APPARATUS AND STORAGE MEDIUM

(71) Applicant: INSPUR SUZHOU INTELLIGENT TECHNOLOGY CO., LTD., Jiangsu (CN)

(72) Inventor: Ying Wang, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/259,691

(22) PCT Filed: Oct. 29, 2021

(86) PCT No.: PCT/CN2021/127408
§ 371 (c)(1),
(2) Date: Jun. 28, 2023

(87) PCT Pub. No.: WO2023/024251
PCT Pub. Date: Mar. 2, 2023

(65) Prior Publication Data
US 2023/0394208 A1    Dec. 7, 2023

(30) Foreign Application Priority Data
Aug. 26, 2021  (CN) .......................... 202110985008.8

(51) Int. Cl.
*G06F 30/33*     (2020.01)
*G06F 11/277*    (2006.01)
(Continued)

(52) U.S. Cl.
CPC ............ *G06F 30/33* (2020.01); *G06F 11/263* (2013.01); *G06F 11/277* (2013.01); *G06F 11/2733* (2013.01)

(58) Field of Classification Search
USPC ........................................................ 716/106
See application file for complete search history.

(56) References Cited

U.S. PATENT DOCUMENTS

| 4,115,854 A | 9/1978 | Capowski et al. |
| 2022/0050946 A1* | 2/2022 | Lee .................... G06F 30/33 |
| 2022/0126864 A1* | 4/2022 | Moustafa ......... G08G 1/096775 |

FOREIGN PATENT DOCUMENTS

| CN | 106503308 A | 3/2017 |
| CN | 110046387 A | 7/2019 |

(Continued)

OTHER PUBLICATIONS

International Search Report and Written Opinion for PCT/CN2021/127408 (dated May 25, 2022).
(Continued)

*Primary Examiner* — Mohammed Alam
(74) *Attorney, Agent, or Firm* — Merchant & Gould P.C.

(57) ABSTRACT

A device verification method, a UVM verification platform, an electronic apparatus, and a storage medium are provided. The method includes: determining a transaction class corresponding to a device under test, and instantiating a first interface in a callback function; sending input data to the device under test based on a bus protocol, and sequentially adding the input data to an array of the first interface according to addresses of the input data; instantiating a second interface in a monitor device, and sequentially adding output data to an array of the second interface according to addresses of the output data; and comparing the input data and the output data that have same addresses in the array of the first interface and the array of the second interface, and outputting a verification result of the device under test according to a comparison result.

20 Claims, 1 Drawing Sheet

(51) Int. Cl.
    *G06F 11/263*     (2006.01)
    *G06F 11/273*     (2006.01)

(56)             References Cited

FOREIGN PATENT DOCUMENTS

| CN | 110618929 A | 12/2019 |
| CN | 112949231 A | 6/2021 |
| CN | 113434355 A | 9/2021 |
| FR | 2386075 A1 | 10/1978 |

OTHER PUBLICATIONS

Search Report for Chinese Patent Application No. 2021109850088 (dated Aug. 26, 2021).

* cited by examiner

DEVICE VERIFICATION METHOD, UVM VERIFICATION PLATFORM, ELECTRONIC APPARATUS AND STORAGE MEDIUM

CROSS-REFERENCE TO RELATED APPLICATION

The present application is a National Stage Filing of PCT International Application No. PCT/CN2021/127408 filed on Oct. 29, 2021, which claims priority to the Chinese patent application No. 202110985008.8, filed before China National Intellectual Property Administration (CNIPA) on Aug. 26, 2021 and entitled "DEVICE VERIFICATION METHOD, UVM VERIFICATION PLATFORM, ELECTRONIC APPARATUS, AND STORAGE MEDIUM", which is incorporated herein by reference in its entirety.

TECHNICAL FIELD

The present disclosure relates to the technical field of computers, in particular to a device verification method, a Universal Verification Methodology (UVM) verification platform, an electronic apparatus, and a storage medium.

BACKGROUND

UVM is a development framework for a verification platform based on a System Verilog class library that allows verification engineers to construct functional verification environments with standardized hierarchies and interfaces by using reusable components provided by the UVM.

For a scoreboard in a conventional UVM verification platform, results of a reference model and a Device Under Test (DUT) are packaged and sent, via Transaction Level Modeling (TLM) level communication provided by the UVM, to the scoreboard for sequential and one-by-one comparison. An inconsistency detected via the comparison indicates an operational error. In practical applications, most buses support out-of-order transmission, that is, actual results under test output by the device under test are not synchronized with sent data, for example, there may be a case where the data is sent early but the output results arrive later. If the comparison is still carried out sequentially one by one, wrong verification results may be generated.

Thus, how to avoid impact of out-of-order transmission in a bus on a device verification result and improve reliability of a UVM verification platform are technical problems that a person having ordinary skill in the art needs to address at present.

SUMMARY

Embodiments of the present disclosure provide a device verification method, a UVM verification platform, an electronic apparatus, and a storage medium, which may avoid impact of out-of-order transmission in a bus on a device verification result and improve reliability of a UVM verification platform.

The embodiments of the present disclosure provide a device verification method applied to a UVM verification platform. The device verification method includes:
  determining a transaction class corresponding to a device under test, and instantiating a first interface in a callback function of the transaction class;
  sending input data to the device under test based on a bus protocol, and sequentially adding the input data to an array of the first interface according to addresses of the input data;
  instantiating a second interface in a monitor device of the UVM verification platform, and sequentially adding output data to an array of the second interface according to addresses of the output data, wherein the output data are processing results of the input data by the device under test; and
  comparing the input data and the output data that have same addresses in the array of the first interface and the array of the second interface, and outputting a verification result of the device under test according to a comparison result.

In some exemplary implementations, before determining the transaction class corresponding to the device under test, the method may further include:
  declaring an interface of a preset type, wherein the interface of the preset type includes an array of a logic type;
  correspondingly, the first interface and the second interface are interfaces of the preset type.

In some exemplary implementations, comparing the input data and the output data that have same addresses in the array of the first interface and the array of the second interface includes:
  sending the input data in the array of the first interface and the output data in the array of the second interface to a scoreboard of the UVM verification platform; and
  comparing the input data and the output data that have the same addresses through the scoreboard.

In some exemplary implementations, sequentially adding the input data to the array of the first interface according to the addresses of the input data include:
  sequentially adding the input data to the array of the first interface according to the addresses of the input data by message sending; and
  correspondingly, sequentially adding the output data to the array of the second interface according to the addresses of the output data includes:
  sequentially adding the output data to the array of the second interface according to the addresses of the output data by message sending.

In some exemplary implementations, sending the input data in the array of the first interface and the output data in the array of the second interface to the scoreboard of the UVM verification platform includes:
  controlling the scoreboard of the UVM verification platform to obtain the input data in the array of the first interface and the output data in the array of the second interface respectively by message receiving.

In some exemplary implementations, instantiating the first interface in the callback function of the transaction class includes:
  instantiating the first interface in a callback function post_randomize of the transaction class.

In some exemplary implementations, outputting the verification result of the device under test according to the comparison result includes:
  determining, according to the comparison result, whether the output data are the same as the input data;
  determining, in response to determining that the output data are the same as the input data, that the device under test passes verification; and
  determining, in response to determining that the output data are not the same as the input data, that the device under test fails to pass the verification and reporting an error.

The embodiments of the present disclosure further provide a UVM verification platform. The UVM verification platform includes:

an interface instantiating module, configured to determine a transaction class corresponding to a device under test, and instantiate a first interface in a callback function of the transaction class;

an input data adding module, configured to send input data to the device under test based on a bus protocol, and sequentially add the input data to an array of the first interface according to addresses of the input data;

an output data adding module, configured to instantiate a second interface in a monitor device of the UVM verification platform, and sequentially add output data to an array of the second interface according to addresses of the output data, wherein the output data are processing results of the input data by the device under test; and a data comparison module, configured to compare the input data and the output data that have same addresses in the array of the first interface and the array of the second interface, and output a verification result of the device under test according to a comparison result.

The embodiments of the present disclosure further provide a storage medium, wherein the storage medium stores a computer program, and the computer program, when being executed by a processor, causes the processor to implement operations performed in the above-mentioned device verification method.

The embodiments of the present disclosure further provide an electronic apparatus. The electronic apparatus includes a memory and a processor, wherein the memory stores a computer program, and the processor, when calling the computer program in the memory, implements operations performed in the above-mentioned device verification method.

The embodiments of the present disclosure provide a device verification method which is applied to a UVM verification platform. The method includes: determining the transaction class corresponding to the device under test, and instantiating the first interface in the callback function of the transaction class; sending the input data to the device under test based on the bus protocol, and sequentially adding all of the input data to the array of the first interface according to the addresses of the input data; instantiating the second interface in the monitor device of the UVM verification platform, and sequentially adding all of the output data to the array of the second interface according to the addresses of the output data, wherein the output data are processing results of the input data by the device under test; and comparing the input data and the output data that have same addresses in the array of the first interface and the array of the second interface, and outputting the verification result of the device under test according to the comparison result.

In the embodiments of the present disclosure, the first interface is instantiated in the transaction class, and then the input data sent by the device under test are stored via the first interface. Since the input data are sent based on the bus protocol, the input data include uniquely corresponding addresses. In the embodiments of the present disclosure, the input data are sequentially added to the array of the first interface based on the addresses at which the input data are transmitted in a bus, that is, the input data in the array of the first interface are arranged in the order of the addresses. After the input data are input to the device under test, the input data are processed by the device under test to obtain the output data. The addresses of the output data are the same as the addresses at which the input data are transmitted in the bus. Thus, in the embodiments of the present disclosure, output data are sequentially added to the array of the second interface according to the addresses of the output data. Since the input data and the output data are sequentially stored in the array of the first interface and the array of the second interface according to the addresses, data sequence relationships in the array of the first interface and the array of the second interface are ensured to be the same and are not out-of-order. In the embodiments of the present disclosure, the corresponding verification result is obtained based on the data comparison result between the input data and the output data that have same addresses in the array of the first interface and the array of the second interface. Thus, by means of the solution provided in the embodiments of the present disclosure, impact of out-of-order transmission in a bus on the device verification result may be avoided, and reliability of a UVM verification platform may be improved. Meanwhile, the embodiments of the present disclosure further provide a UVM verification platform, an electronic apparatus, and a storage medium. The UVM verification platform, the electronic apparatus, and the storage medium have the above beneficial effects, which are not repeated here.

BRIEF DESCRIPTION OF THE DRAWINGS

In order to more clearly describe the embodiments of the present disclosure, the drawings that are to be referred for the embodiments will be briefly described hereinafter. Apparently, the drawings described hereinafter merely illustrate some embodiments of the present disclosure, and a person having ordinary skill in the art may derive other drawings based on the drawings described herein without any creative effort.

DETAILED DESCRIPTION

In order to make the objective, technical solutions and advantages of the embodiments of the present disclosure clearer, the technical solutions in the embodiments of the present disclosure will be clearly and completely described below with reference to the accompanying drawings in the embodiments of the present disclosure. Apparently, the described embodiments are part of the embodiments of the present disclosure, rather than all the embodiments. Based on the embodiments of the present disclosure, all other embodiments obtained by a person having ordinary skill in the art without any creative effort fall within the protection scope of the present disclosure.

Figure 1:
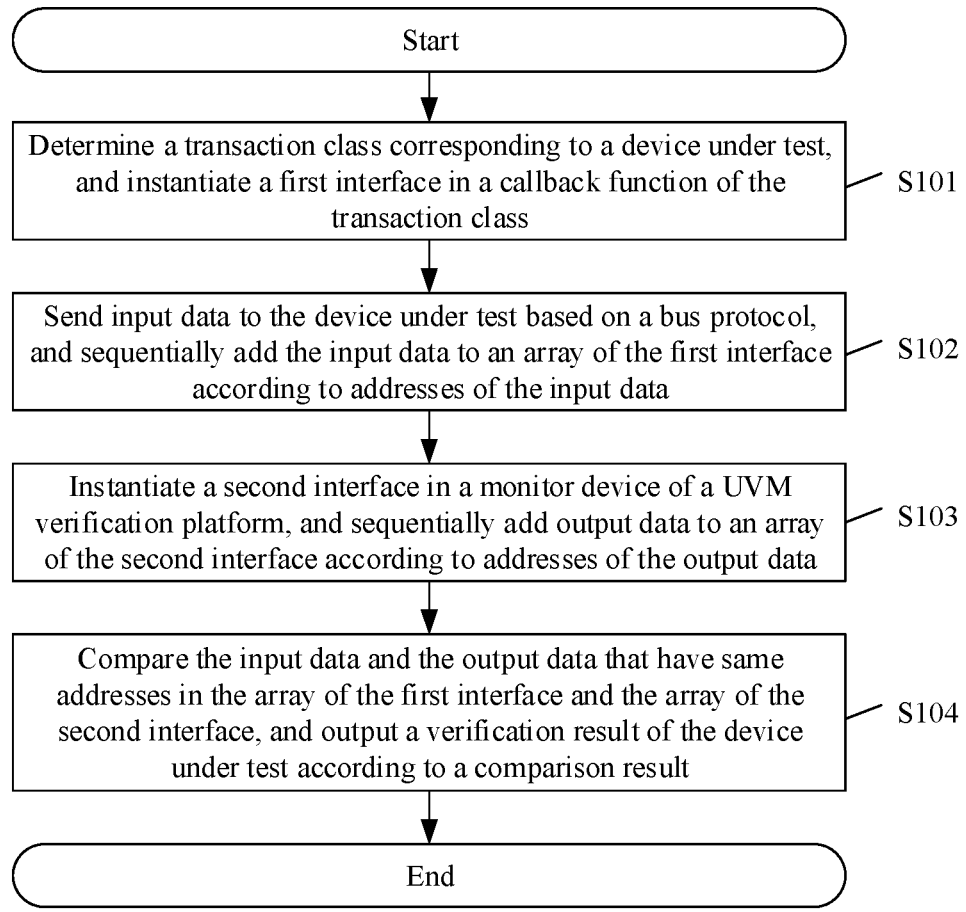
FIG. 1 is a flow diagram of a device verification method according to the embodiments of the present disclosure.

Referring to FIG. 1, FIG. 1 is a flow diagram of a device verification method according to the embodiments of the present disclosure.

The device verification method may include operations S101 to S104 which are described in detail below.

At S101, a transaction class corresponding to a device under test is determined, and a first interface is instantiated in a callback function of the transaction class.

The embodiments may be applied to the UVM verification platform. The UVM verification platform provides a set of library files based on the System-Verilog language, such that verification efficiency of digital circuits may be improved. The set of library files of the UVM verification platform include a plurality of common base classes and methods, and also standardize the structure and operation process of the verification platform, such that a verifier may construct a standardized verification platform quickly and efficiently. Since the scale of System on Chip (SoC) projects is getting larger, and a system is getting more complex, the difficulty of verification is increasing accordingly. The UVM may help to meet the verification requirements, improve the reusability of a verification environment and improve the verification efficiency.

Transaction is a class defined in the UVM verification platform, and all data to be used in testing are packaged in the transaction class (service class). Each device under test may have a corresponding transaction class. In the embodiments, the transaction class corresponding to the device under test is determined after the device under test is determined, and then the first interface is instantiated in the callback function of the transaction class. The first interface may include an array of a logic type in order to store input data. For example, in the embodiments, the first interface may be instantiated in a callback function post_randomize of the transaction class.

At S102, input data are sent to the device under test based on a bus protocol, and the input data are sequentially added to an array of the first interface according to addresses of the input data.

The UVM verification platform may send the input data to the device under test based on the bus protocol such that the device under test may process the input data. The above input data may be randomly generated data, and when the input data are sent to the device under test based on the bus protocol, each piece of the input data has a uniquely corresponding address, and the address remains unchanged in a result obtained after the input data are processed by the device under test. In the embodiments, the input data are sequentially added to the array of the first interface according to the addresses of the input data. For example, in the embodiments, the input data may be sequentially added to the array of the first interface in an ascending order of the addresses.

At S103, a second interface is instantiated in a monitor device of the UVM verification platform, and output data are sequentially added to an array of the second interface according to addresses of the output data.

The monitor device of the UVM verification platform is configured to monitor the output data of the device under test, wherein the output data are processing results of the input data by the device under test. In the embodiments, the second interface is instantiated in the monitor device of the UVM verification platform, and the second interface may include an array of a logic type in order to store the output data. In the embodiments, output data are sequentially added to the array of the second interface according to the addresses of the output data. For example, in the embodiments, output data may be sequentially added to the array of the second interface in an ascending order of the addresses.

At S104, the input data and the output data that have same addresses in the array of the first interface and the array of the second interface are compared, and a verification result of the device under test is output according to a comparison result.

The input data in the array of the first interface are stored according to the addresses, and the output data in the array of the second interface are stored according to the same addresses. Thus, in the embodiments, the input data and the output data that have same addresses in the array of the first interface and the array of the second interface may be compared, and then the verification result of the device under test is output according to the comparison result. An example is provided to illustrate the above process. For example, the input data stored in the array of the first interface include A1, A2 and A3 sequentially, and results output by the device under test are A2', A3' and A1' in succession. The output data stored in the array of the second interface based on the addresses sequentially include A1', A2' and A3', such that when the input data and the output data that have same addresses in the array of the first interface and the array of the second interface are compared, A1 may be compared with A1', A2 may be compared with A2', and A3 may be compared with A3', thereby avoiding the impact of out-of-order output results on the verification result.

In the embodiments, the first interface is instantiated in the transaction class, and then the input data sent by the device under test are stored via the first interface. Since the input data are sent based on the bus protocol, the input data include uniquely corresponding addresses. In the embodiments, the input data are sequentially added to the array of the first interface based on the addresses at which the input data are transmitted in a bus, that is, the input data in the array of the first interface are arranged in the order of the addresses. After the input data are input to the device under test, the input data are processed by the device under test to obtain the output data. The addresses of the output data are the same as the addresses at which the input data are transmitted in the bus. Thus, in the embodiments, output data are sequentially added to the array of the second interface according to the addresses of the output data. Since the input data are sequentially stored in the array of the first interface according to the addresses, and the output data are sequentially stored in the array of the second interface according to the addresses, data sequence relationships in the array of the first interface and the array of the second interface are kept the same and are not out-of-order. In the embodiments, the corresponding verification result is obtained based on the data comparison result between the input data and the output data that have same addresses in the array of the first interface and the array of the second interface. Thus, by means of the embodiments, impact of out-of-order transmission in a bus on the device verification result may be avoided, and reliability of a UVM verification platform may be improved. In the embodiments, the data input to the device under test and the result data output from the device under test are respectively connected to an interface, and are stored for comparison by changing values of the interface, such that the UVM verification platform may adapt to more test scenarios and the verification may be more flexible and efficient.

As a further description of the embodiments corresponding to FIG. 1, an interface of a preset type may be declared before the transaction class corresponding to the device under test is determined. The interface of the preset type includes an array of a logic type, and correspondingly, the first interface and the second interface are interfaces of the preset type.

As a further description of the embodiments corresponding to FIG. 1, the input data may be compared with the output data by using a scoreboard of the UVM verification platform. For example, the input data in the array of the first interface and the output data in the array of the second interface may be sent to the scoreboard of the UVM verification platform, and the input data and the output data that have the same addresses are compared through the scoreboard.

For example, the input data may be sequentially added to the array of the first interface according to the addresses of the input data by message sending; and output data may also be sequentially added to the array of the second interface according to the addresses of the output data by message sending. The scoreboard obtains the input data in the array of the first interface and the output data in the array of the second interface respectively by message receiving.

As a feasible implementation, in the embodiments corresponding to FIG. 1, the verification result of the device under test may be determined in the following way. Whether the output data are the same as the input data may be determined according to the comparison result; in response to determining that the output data are the same as the input data, it may be determined that the device under test passes verification; and in response to determining that the output data are not the same as the input data, it may be determined that the device under test fails to pass the verification, and an error is reported.

The process described in the above embodiments is illustrated in a following embodiment which is applied in practical applications. The embodiment provides a UVM-based verification platform for out-of-order messages in the bus. The operating steps for comparison of out-of-order message results of the verification platform are described as follows.

In operation 1, an interface A including an array of a logic type with a depth equal to a memory address range in the actual test is declared. An array is used to simulate a memory where the data transmitted in the bus are to be stored.

In operation 2, an interface A1 of type A is instantiated in the callback function post_randomize of the transaction, and randomly generated transaction data are stored in an array of the interface according to addresses of the transaction data based on the requirements of a bus protocol under test.

In operation 3, in the monitor device, another interface A2 of type A is instantiated, the output data of the device under test are monitored and then stored in an array of the interface A2 according to addresses of the output data based on the specification of the bus protocol.

In operation 4, the interfaces are delivered between different devices of the platform by using a config_db mechanism. At the top layer of a test environment, messages are sent to the interface A1 and the interface A2 in the above two devices respectively by using uvm_config_db #(virtual interface A)::set.

In operation 5, in the scoreboard, messages are received by using uvm_config_db #(virtual interface A)::get, so as to obtain parameters of the interface A1 and the interface A2 respectively. Moreover, the array data stored in the two interfaces are compared in the scoreboard.

In operation 6, because the data are stored in the arrays of the interfaces according to the addresses of the data, the out-of-order problem during bus transmission may be avoided. Whether the data of the output result of the device under test stored in the corresponding addresses of the memory are equal to data that are initially randomly generated and sent by the platform is directly determined through comparison.

In the embodiments, the data input to the device under test and the result data output from the device under test are connected to an interface, and are stored for comparison by changing values of the interface, such that the UVM verification platform may adapt to more test scenarios and the verification may be more flexible and efficient.

Figure 2:
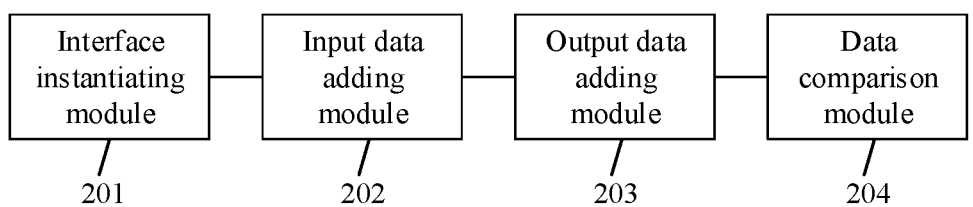
FIG. 2 is a schematic structural diagram of a UVM verification platform according to the embodiments of the present disclosure.

Referring to FIG. 2, FIG. 2 is a schematic structural diagram of a UVM verification platform according to the embodiments of the present disclosure. The UVM verification platform may include:

an interface instantiating module 201, configured to determine a transaction class corresponding to a device under test, and instantiate a first interface in a callback function of the transaction class;

an input data adding module 202, configured to send input data to the device under test based on a bus protocol, and sequentially add the input data to an array of the first interface according to addresses of the input data;

an output data adding module 203, configured to instantiate a second interface in a monitor device of the UVM verification platform, and sequentially add output data to an array of the second interface according to addresses of the output data, wherein the output data are processing results of the input data by the device under test; and a data comparison module 204, configured to compare the input data and the output data that have same addresses in the array of the first interface and the array of the second interface, and output a verification result of the device under test according to a comparison result.

In the embodiments of the present disclosure, the first interface is instantiated in the transaction class, and then the input data sent by the device under test are stored via the first interface. Since the input data are sent based on the bus protocol, the input data include uniquely corresponding addresses. In the embodiments of the present disclosure, the input data are sequentially added to the array of the first interface based on the addresses at which the input data are transmitted in a bus, that is, the input data in the array of the first interface are arranged in the order of the addresses. After the input data are input to the device under test, the input data are processed by the device under test to obtain the output data. Since the addresses of the input data and the output data do not change when the input data and the output data are transmitted in the bus, in the embodiments of the present disclosure, output data are sequentially added to the array of the second interface according to the addresses of the output data. Since the input data and the output data are sequentially stored in the array of the first interface and the array of the second interface according to the addresses, data sequence relationships in the array of the first interface and the array of the second interface are ensured to be the same and are not out-of-order. In the embodiments of the present disclosure, the corresponding verification result is obtained based on the data comparison result between the input data and the output data that have same addresses in the array of the first interface and the array of the second interface. Thus, by means of the solution provided in the embodiments of the present disclosure, impact of out-of-order transmission in a bus on the device verification result may be avoided, and reliability of a UVM verification platform may be improved.

In some exemplary implementations, the UVM verification platform may further include:

an interface declaring module, configured to declare an interface of a preset type before the transaction class corresponding to the device under test is determined, the interface of the preset type including an array of a logic type.

Correspondingly, the first interface and the second interface are interfaces of the preset type.

In some exemplary implementations, the data comparison module 204 may be configured to send the input data in the array of the first interface and the output data in the array of the second interface to a scoreboard of the UVM verification platform, and may be further configured to compare the input data and the output data that have the same addresses through the scoreboard.

In some exemplary implementations, the input data adding module 202 may be configured to sequentially add the input data to the array of the first interface according to the addresses of the input data by message sending.

Correspondingly, the output data adding module 203 may be configured to sequentially add output data to the array of the second interface according to the addresses of the output data by message sending.

In some exemplary implementations, the scoreboard is configured to obtain the input data in the array of the first interface and the output data in the array of the second interface respectively by message receiving.

In some exemplary implementations, the interface instantiating module 201 may be configured to instantiate the first interface in a callback function post_randomize of the transaction class.

In some exemplary implementations, the data comparison module 204 may be configured to determine, according to the comparison result, whether the output data are the same as the input data; determine, in response to determining that the output data are the same as the input data, that the device under test passes verification; and determine, in response to determining that the output data are not the same as the input data, that the device under test fails to pass the verification, and report an error.

Since the embodiments of the system section correspond to the embodiments of the method section, the embodiments of the system section may refer to the description of the embodiments of the method section, which will not be repeated herein.

The embodiments of the present disclosure further provide a storage medium that stores a computer program. The computer program, when being executed by a processor, may cause the processor to implement the operations provided by the above embodiments. The storage medium may include a USB flash disk, a mobile hard disk, a Read-Only Memory (ROM), a Random Access Memory (RAM), a disk, a compact disc, or other media capable of storing program codes.

The embodiments of the present disclosure further provide an electronic apparatus. The electronic apparatus may include a memory and a processor. The memory has a computer program stored therein. The processor, when calling the computer program in the memory, may implement the operations provided by the above embodiment. Of course, the electronic apparatus may also include various network interfaces, power supplies and other components.

The embodiments in the specification are described in a progressive manner, where each embodiment focuses on the differences from the other embodiments, and the same or similar parts between the embodiments may be cross-referenced. Since the system disclosed by the embodiments corresponds to the method disclosed by the embodiments, the description is relatively simple, and reference may be made to the description of the method section for relevant information. It is to be noted that a person having ordinary skill in the art may also make improvements and modifications to the present disclosure without departing from the principles of the present disclosure, and these improvements and modifications also fall within the protection scope of the claims of the present disclosure.

It is also to be noted that in this specification, relational terms such as "first" and "second" are merely used to distinguish one entity or operation from another entity or operation, and do not necessarily require or imply any such actual relationship or order between these entities or operations. Moreover, the terms "include" "include" or any other variants thereof are intended to cover non-exclusive inclusion, so that a process, method, article or apparatus including a series of elements not only includes those elements, but also includes other elements not clearly listed, or also includes elements inherent to this process, method, article or apparatus. An element proceeded by the phrase "includes a" does not, without more constraints, preclude the existence of additional identical elements in the process, method, article, or apparatus that includes the element.

What is claimed is:

1. A device verification method, applied to a Universal Verification Methodology (UVM) verification platform and comprising:
   determining a transaction class corresponding to a device under test, and instantiating a first interface in a callback function of the transaction class;
   sending input data to the device under test based on a bus protocol, and sequentially adding the input data to an array of the first interface according to addresses of the input data;
   instantiating a second interface in a monitor device of the UVM verification platform, and sequentially adding output data to an array of the second interface according to addresses of the output data, wherein the output data are processing results of the input data by the device under test; and
   comparing the input data and the output data that have same addresses in the array of the first interface and the array of the second interface, and outputting a verification result of the device under test according to a comparison result,
   wherein comparing the input data and the output data that have same addresses in the array of the first interface and the array of the second interface comprises:
   sending the input data in the array of the first interface and the output data in the array of the second interface to a scoreboard of the UVM verification platform; and
   comparing the input data and the output data that have the same addresses through the scoreboard.

2. The device verification method according to claim 1, wherein before determining the transaction class corresponding to the device under test, the method further comprises:
   declaring an interface of a preset type, wherein the interface of the preset type comprises an array of a logic type;
   correspondingly, the first interface and the second interface are interfaces of the preset type.

3. The device verification method according to claim 1, wherein sequentially adding the input data to the array of the first interface according to the addresses of the input data comprises:
   sequentially adding the input data to the array of the first interface according to the addresses of the input data by message sending; and
   correspondingly, sequentially adding the output data to the array of the second interface according to the addresses of the output data comprises:

sequentially adding the output data to the array of the second interface according to the addresses of the output data by message sending.

4. The device verification method according to claim 3, wherein sending the input data in the array of the first interface and the output data in the array of the second interface to the scoreboard of the UVM verification platform comprises:
controlling the scoreboard of the UVM verification platform to obtain the input data in the array of the first interface and the output data in the array of the second interface respectively by message receiving.

5. The device verification method according to claim 1, wherein instantiating the first interface in the callback function of the transaction class comprises:
instantiating the first interface in a callback function post randomize of the transaction class.

6. The device verification method according to claim 1, wherein outputting the verification result of the device under test according to the comparison result comprises:
determining, according to the comparison result, whether the output data are the same as the input data;
determining, in response to determining that the output data are the same as the input data, that the device under test passes verification; and
determining, in response to determining that the output data are not the same as the input data, that the device under test fails to pass the verification and reporting an error.

7. An electronic apparatus, comprising a memory and a processor, wherein the memory stores a computer program, and the processor, when calling the computer program in the memory, implements following operations:
determining a transaction class corresponding to a device under test, and instantiating a first interface in a callback function of the transaction class;
sending input data to the device under test based on a bus protocol, and sequentially adding the input data to an array of the first interface according to addresses of the input data;
instantiating a second interface in a monitor device of a Universal Verification Methodology (UVM) verification platform, and sequentially adding output data to an array of the second interface according to addresses of the output data, wherein the output data are processing results of the input data by the device under test; and
comparing the input data and the output data that have same addresses in the array of the first interface and the array of the second interface, and outputting a verification result of the device under test according to a comparison result,
wherein comparing the input data and the output data that have same addresses in the array of the first interface and the array of the second interface comprises:
sending the input data in the array of the first interface and the output data in the array of the second interface to a scoreboard of the UVM verification platform; and
comparing the input data and the output data that have the same addresses through the scoreboard.

8. A non-transitory storage medium, wherein the non-transitory storage medium stores a computer executable instruction, and the computer executable instruction, when loaded and executed by a processor, causes the processor to implement following operations:
determining a transaction class corresponding to a device under test, and instantiating a first interface in a callback function of the transaction class;
sending input data to the device under test based on a bus protocol, and sequentially adding the input data to an array of the first interface according to addresses of the input data;
instantiating a second interface in a monitor device of a Universal Verification Methodology (UVM) verification platform, and sequentially adding output data to an array of the second interface according to addresses of the output data, wherein the output data are processing results of the input data by the device under test; and
comparing the input data and the output data that have same addresses in the array of the first interface and the array of the second interface, and outputting a verification result of the device under test according to a comparison result,
wherein comparing the input data and the output data that have same addresses in the array of the first interface and the array of the second interface comprises:
sending the input data in the array of the first interface and the output data in the array of the second interface to a scoreboard of the UVM verification platform; and
comparing the input data and the output data that have the same addresses through the scoreboard.

9. The device verification method according to claim 1, wherein all data to be used in testing are packaged in the transaction class, each device under test has a corresponding transaction class, and determining the transaction class corresponding to the device under test comprises:
determining the transaction class corresponding to the device under test based on correspondence between each device under test and the corresponding transaction class.

10. The device verification method according to claim 1, wherein each piece of the input data has a uniquely corresponding address, and the uniquely corresponding address remains unchanged in a result obtained after the input data are processed by the device under test.

11. The device verification method according to claim 2, wherein the array of the logic type has a depth equal to a memory address range in actual test.

12. The electronic apparatus according to claim 7, wherein the processor, when calling the computer program in the memory, further implements following operations before determining the transaction class corresponding to the device under test:
declaring an interface of a preset type, wherein the interface of the preset type comprises an array of a logic type;
correspondingly, the first interface and the second interface are interfaces of the preset type.

13. The electronic apparatus according to claim 7, wherein sequentially adding the input data to the array of the first interface according to the addresses of the input data comprises:
sequentially adding the input data to the array of the first interface according to the addresses of the input data by message sending; and
correspondingly, sequentially adding the output data to the array of the second interface according to the addresses of the output data comprises:
sequentially adding the output data to the array of the second interface according to the addresses of the output data by message sending.

14. The electronic apparatus according to claim 13, wherein sending the input data in the array of the first interface and the output data in the array of the second interface to the scoreboard of the UVM verification platform comprises:
    controlling the scoreboard of the UVM verification platform to obtain the input data in the array of the first interface and the output data in the array of the second interface respectively by message receiving.

15. The electronic apparatus according to claim 7, wherein instantiating the first interface in the callback function of the transaction class comprises:
    instantiating the first interface in a callback function post_randomize of the transaction class.

16. The electronic apparatus according to claim 7, wherein outputting the verification result of the device under test according to the comparison result comprises:
    determining, according to the comparison result, whether the output data are the same as the input data;
    determining, in response to determining that the output data are the same as the input data, that the device under test passes verification; and
    determining, in response to determining that the output data are not the same as the input data, that the device under test fails to pass the verification and reporting an error.

17. The non-transitory storage medium according to claim 8, wherein the computer executable instruction, when loaded and executed by a processor, causes the processor to further implement following operations before determining the transaction class corresponding to the device under test:
    declaring an interface of a preset type, wherein the interface of the preset type comprises an array of a logic type;
    correspondingly, the first interface and the second interface are interfaces of the preset type.

18. The non-transitory storage medium according to claim 8, wherein sequentially adding the input data to the array of the first interface according to the addresses of the input data comprises:
    sequentially adding the input data to the array of the first interface according to the addresses of the input data by message sending; and
    correspondingly, sequentially adding the output data to the array of the second interface according to the addresses of the output data comprises:
    sequentially adding the output data to the array of the second interface according to the addresses of the output data by message sending.

19. The non-transitory storage medium according to claim 18, wherein sending the input data in the array of the first interface and the output data in the array of the second interface to the scoreboard of the UVM verification platform comprises:
    controlling the scoreboard of the UVM verification platform to obtain the input data in the array of the first interface and the output data in the array of the second interface respectively by message receiving.

20. The non-transitory storage medium according to claim 8, wherein outputting the verification result of the device under test according to the comparison result comprises:
    determining, according to the comparison result, whether the output data are the same as the input data;
    determining, in response to determining that the output data are the same as the input data, that the device under test passes verification; and
    determining, in response to determining that the output data are not the same as the input data, that the device under test fails to pass the verification and reporting an error.

\* \* \* \* \*